United States Patent
Udagawa et al.

(10) Patent No.: US 9,291,686 B2
(45) Date of Patent: Mar. 22, 2016

(54) METHOD OF ESTIMATING THE RESIDUAL MAGNETIC FLUX OF TRANSFORMER AND RESIDUAL MAGNETIC FLUX ESTIMATION DEVICE

(75) Inventors: Keisuke Udagawa, Chiba (JP); Tadashi Koshizuka, Saitama (JP); Minoru Saitoh, Kanagawa (JP); Yoshimasa Sato, Kanagawa (JP); Hiroyuki Maehara, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 584 days.

(21) Appl. No.: 13/812,255

(22) PCT Filed: Jul. 22, 2011

(86) PCT No.: PCT/JP2011/004151
§ 371 (c)(1),
(2), (4) Date: Mar. 27, 2013

(87) PCT Pub. No.: WO2012/014425
PCT Pub. Date: Feb. 2, 2012

(65) Prior Publication Data
US 2013/0176021 A1      Jul. 11, 2013

(30) Foreign Application Priority Data
Jul. 26, 2010   (JP) ................. 2010-167017

(51) Int. Cl.
*G01R 33/02*    (2006.01)
*H02H 7/04*     (2006.01)
(Continued)

(52) U.S. Cl.
CPC ............ *G01R 33/02* (2013.01); *G01R 33/0064* (2013.01); *G01R 33/12* (2013.01)

(58) Field of Classification Search
CPC .......... G01R 33/02; H02H 7/04; H02H 3/00; H02H 3/08; H02H 9/02; H01H 47/00; H01H 47/32

USPC ........ 324/244, 260, 207.18; 323/355; 361/35, 361/157, 159
See application file for complete search history.

(56) References Cited

U.S. PATENT DOCUMENTS 5,450,310 A * 9/1995 Kawakami .......... H02M 7/1623
                                                       363/27
5,495,403 A * 2/1996 Dhyanchand ......... H02M 7/483
                                                       363/43
(Continued)

FOREIGN PATENT DOCUMENTS

JP     06-276669 A  *  3/1993
JP     2002-75145 A     3/2002
(Continued)

OTHER PUBLICATIONS

Kajimura, "Neutral-Point Grounding Apparatus", 1993, Machine Translation, p. 6.*

(Continued)

*Primary Examiner* — Patrick Assouad
*Assistant Examiner* — Lamarr Brown
(74) *Attorney, Agent, or Firm* — Holtz, Holtz & Volek PC

(57) ABSTRACT

A residual magnetic flux estimation device 1 includes a DC power-source control device 11 which controls a DC power source 300 to apply a DC voltage across two terminals of a Δ connection that is a secondary winding or a tertiary winding, a voltage measuring device 12 which measures a terminal voltage at the primary side of a three-phase transformer 200, a computing device 13 that determines a phase having a high voltage between the two phases other than the phase to which the voltage is applied, and a residual magnetic flux measuring device 14 that measures a phase-to-phase residual magnetic flux between the two phases other than the high-voltage phase, and estimates a measured value of the phase-to-phase residual magnetic flux as a maximum residual magnetic flux in the measurement-target three-phase transformer.

10 Claims, 7 Drawing Sheets

(51) Int. Cl.
*H01H 47/00* (2006.01)
*G01R 33/00* (2006.01)
*G01R 33/12* (2006.01)

(56) References Cited

U.S. PATENT DOCUMENTS

| | | | | |
|---|---|---|---|---|
| 5,781,428 | A * | 7/1998 | Paice | H01F 30/12 363/126 |
| 5,886,888 | A * | 3/1999 | Akamatsu | H02J 3/01 363/65 |
| 5,998,975 | A * | 12/1999 | Tada | H02K 7/1861 322/25 |
| 6,393,265 | B1 * | 5/2002 | Smith | H04B 1/18 455/292 |
| 6,566,895 | B2 * | 5/2003 | Estrela | G01R 19/2513 307/17 |
| 6,944,033 | B1 * | 9/2005 | Xu | H02M 3/1584 363/16 |
| 2003/0016724 | A1 * | 1/2003 | Fishman | H05B 6/04 373/146 |
| 2009/0097173 | A1 * | 4/2009 | Kinoshita | H02H 9/002 361/35 |
| 2009/0134862 | A1 * | 5/2009 | Kinoshita | H02H 9/002 323/361 |
| 2010/0039737 | A1 | 2/2010 | Koshizuka et al. | |
| 2010/0141235 | A1 | 6/2010 | Koshiduka et al. | |
| 2011/0181989 | A1 * | 7/2011 | Udagawa | H02H 9/002 361/35 |

FOREIGN PATENT DOCUMENTS

| | | | | |
|---|---|---|---|---|
| JP | 2008-140580 A | 6/2008 | | |
| JP | 2008-160100 A | 7/2008 | | |
| JP | 1980864 A1 * | 10/2008 | | G01R 33/14 |
| JP | 2010-4686 A | 1/2010 | | |
| JP | 2010-73666 A | 4/2010 | | |

OTHER PUBLICATIONS

International Search Report dated Sep. 27, 2011 (in English) in counterpart International Application No. PCT/JP2011/004151.
John H. Brunke et al; Elimination of Transformer Inrush Currents by Controlled Switching; Part 1—Theoretical Considerations; pp. 1-6; IEEE Trans; vol. 16, No. 2; 2001.

* cited by examiner

METHOD OF ESTIMATING THE RESIDUAL MAGNETIC FLUX OF TRANSFORMER AND RESIDUAL MAGNETIC FLUX ESTIMATION DEVICE

TECHNICAL FIELD

The embodiments described herein relate to a method of estimating the residual magnetic flux of a transformer and a residual magnetic flux estimation device.

BACKGROUND ART

When a transformer core is subjected to a no-load excitation with magnetic fluxes remained through a power-on, a large excitation inrush current flows depending on a loaded phase. It is commonly known that the magnitude of this excitation inrush current becomes several times as much as a rated load current of the transformer. When such a large excitation inrush current flows, the system voltage fluctuates. This may affect a user when the voltage fluctuation is large.

Conventionally, the following various methods for suppressing the excitation inrush current are known.

(1) Connect a breaker with a resistor having the loaded resistor and a contact connected in series to a breaker main contact in parallel to load the breaker with the resistor prior to the breaker main contact.

(2) Load an arbitrary phase in advance when a three-phase transformer of a direct-grounding system is loaded with three single-phase breakers, and then load. the remaining two phases.

(3) Load arbitrary two phases in advance when a three-phase transformer of a non-effective grounding system is loaded with three single-phase breakers, and then load the remaining one phase.

(4) Use a three-phase batch-operation type breaker having a single operation mechanism that performs loading and an opening operation simultaneously on a three-phase breaker.

BACKGROUND ART DOCUMENT

Patent Literature

Patent Literature 1: JP 2002-75145 A
Patent Literature 2: JP 2008-162474 A
Patent Literature 3: JP 2008-160100 A

Non-Patent Literature

Non-patent Literature 1: IEEE Trans. Vol. 16, No. 2 2001 "Elimination of Transformer Inrush Currents by Controlled Switching—Part I: Theoretical Considerations"

In order to suppress an excitation inrush current at the time of letting the transformer loaded, it is necessary to grasp the magnitude of the residual magnetic flux of the core when the transformer is cut off. In general, such a magnitude of the residual magnetic flux of the transformer is obtained by integrating a voltage across the terminals of the transformer when the transformer is cut off. That is, if a charging time is sufficiently long when the transformer is cut off, the magnetic flux of the core is a change in a steady state, the residual magnetic flux can be obtained by the integration of a voltage before and after the cut-off, and the residual magnetic flux before the charging does not affect.

Conversely, when a field test or an inspection, etc., of the transformer is carried out, the residual magnetic flux measured when the transformer is cut off is not always maintained until the next loading of the transformer. In a field test or an inspection of the transformer, for example, a winding resistance measurement or a polarity check on a current transformer may be performed. In general, the winding resistance measurement or the polarity check is performed by applying a DC voltage to the winding of the transformer. Hence, the residual magnetic flux generated when the transformer is cut off changes due to the effect of the applied DC voltage, and thus the residual magnetic flux has a value changed when a test or an inspection completes.

As illustrated in FIG. 7, when a DC voltage P is applied, a voltage is measured to obtain a magnetic flux R, and when a voltage is integrated from the time point at which the DC voltage is applied, it becomes to change from 0. That is, the residual magnetic flux of the core before the application of the DC voltage does not appear in integration of the voltage. In FIG. 7, after the application of the DC voltage, although the integration of the voltage becomes a constant value, this is not an accurate residual magnetic flux of the core. Hence, the accurate residual magnetic flux R of the core needs the consideration of the residual magnetic flux before the application of the DC voltage.

As explained above, in the case of carrying out a field test or an inspection, etc., accompanying an application of a DC voltage to the winding of the transformer, such as a winding resistance measurement of the transformer or a polarity check of the current transformer, a technology has been desired which can estimate the residual magnetic flux after the test or the inspection.

Embodiments disclosed herein have been proposed in order to address the above-explained disadvantages of the prior art. It is an object of the subject matter disclosed herein is to provide a method and device that estimate a residual magnetic flux after a test or an inspection when the field test or the inspection accompanying an application of a DC voltage to the winding of a transformer is carried out.

SUMMARY

In order to accomplish the above object, an embodiment disclosed herein includes: a step for applying, to a three-phase transformer having a primary winding connected to a Y connection and a secondary winding or a tertiary winding subjected to a Δ connection, a DC voltage to a phase connected between predetermined two terminals of the Δ connection; a step for measuring terminal voltages of two phases other than the phase to which the DC voltage is applied at a primary side of the three-phase transformer; a step for determining a phase having a high measured terminal voltage as a high-voltage phase between the two phases where the terminal voltages are measured; and a step for measuring phase-to-phase residual magnetic flux between the two phases other than the high-voltage phase and estimating the phase-to-phase residual magnetic flux as a maximum residual magnetic flux in the measurement-target three-phase transformer.

A transformer residual magnetic flux estimating method including: a step for applying a DC voltage to a phase connected between predetermined two terminals of the Δ connection; a step for measuring a terminal voltage of each terminal of the Δ connection of the three-phase transformer and calculating a line voltage of each phase connected between respective terminals by subtracting each measured terminal voltage; a step for determining a phase having a higher calculated line voltage as a high-voltage phase between the two phases other than the phase to which the DC voltage is applied among respective phases where the terminal voltages are measured; and a step for measuring a phaseto-phase residual magnetic flux between the two phases other than the high-voltage phase and estimating the phase-to-phase residual magnetic flux as a maximum residual magnetic flux in the measurement-target three-phase transformer, is also an embodiment of the present invention.

Moreover, a device that realizes the above-explained residual magnetic flux estimating methods is also an embodiment of the present invention.

DETAILED DESCRIPTION

Embodiments will now be explained in detail with reference to FIGS. 1 to 6.

1. First Embodiment

A scope of a first embodiment is, for example, a winding resistance measurement of a transformer or a polarity check of a current transformer, such as cases in which a residual magnetic flux generated when the transformer is cut off changes inherent to carrying out a field test or an inspection accompanying an application of a DC voltage to the winding of a transformer, and the residual magnetic flux has a value changed when the test or the inspection completes.

The structures and workings of a residual magnetic flux estimation device 1 of this embodiment, a breaker 100 allowing this device 1 to perform a residual magnetic flux estimating method, and the structures and workings of a transformer 200 and a DC power source 300 will be explained below.

[1-1. Structure]

Figure 1:
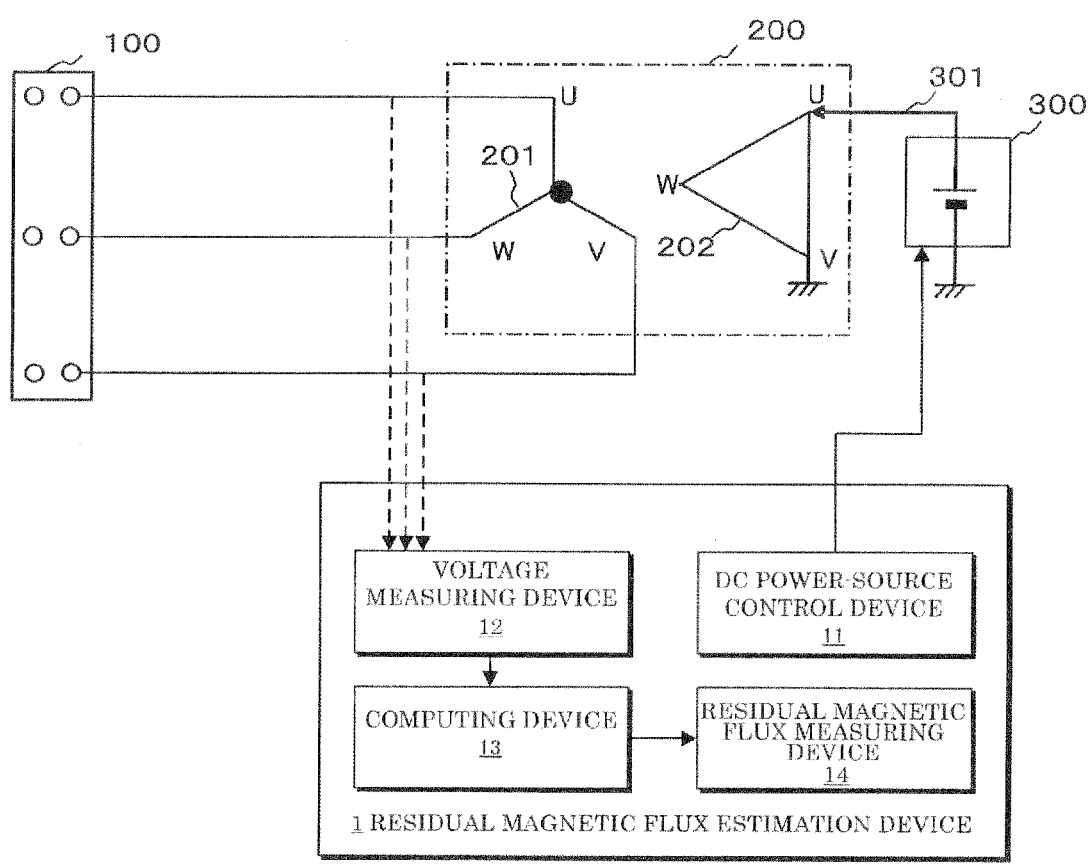
FIG. 1 is a block diagram illustrating a connection relationship among a residual magnetic flux estimation device, a transformer, and a breaker according to the first and the third embodiments.
Figure 2:
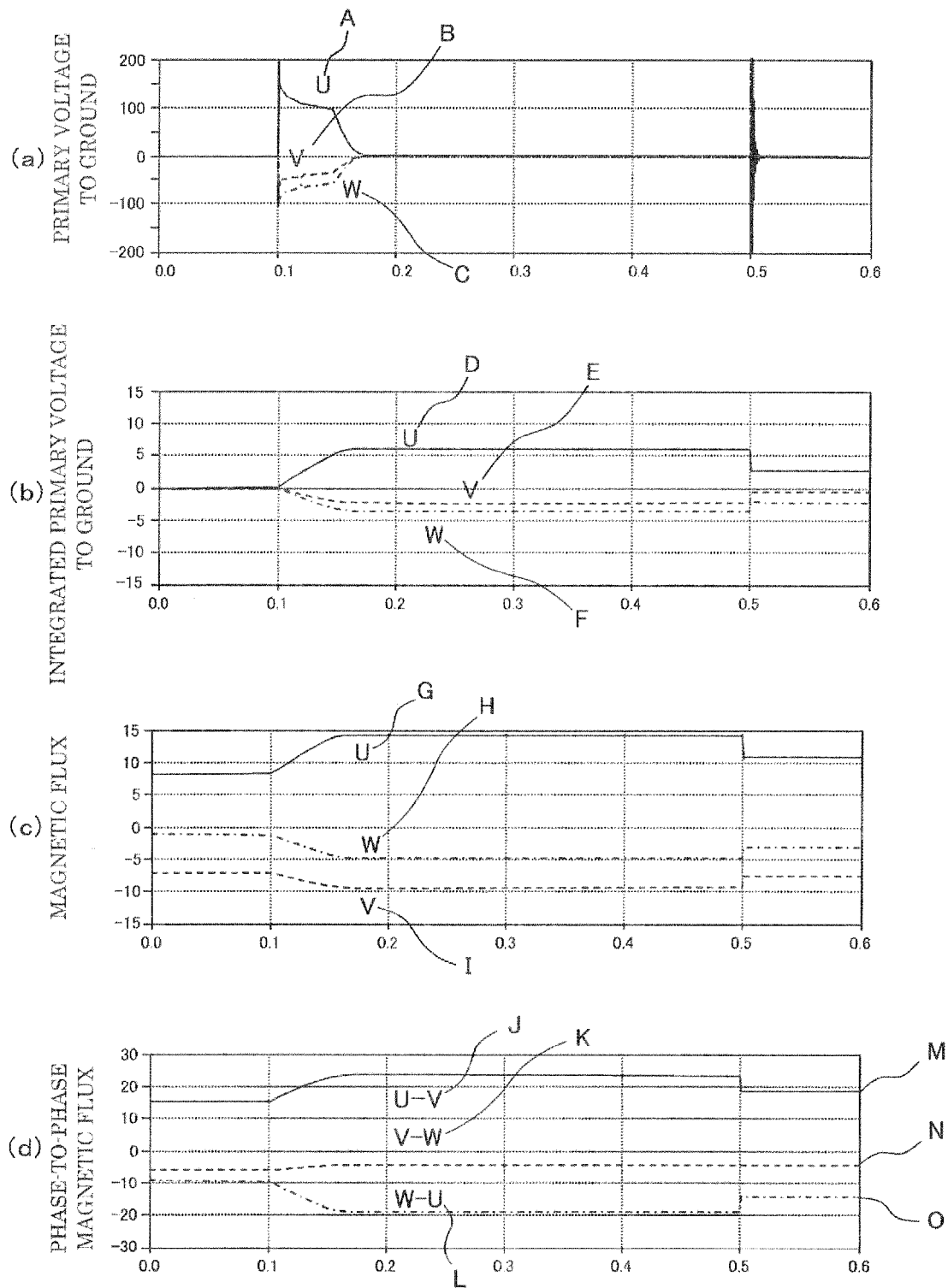
FIGS. 2A to 2D are graphs illustrating a relationship between a DC voltage applying terminal and a phase-to-phase magnetic flux according to the first to the fourth embodiments.
Figure 3:
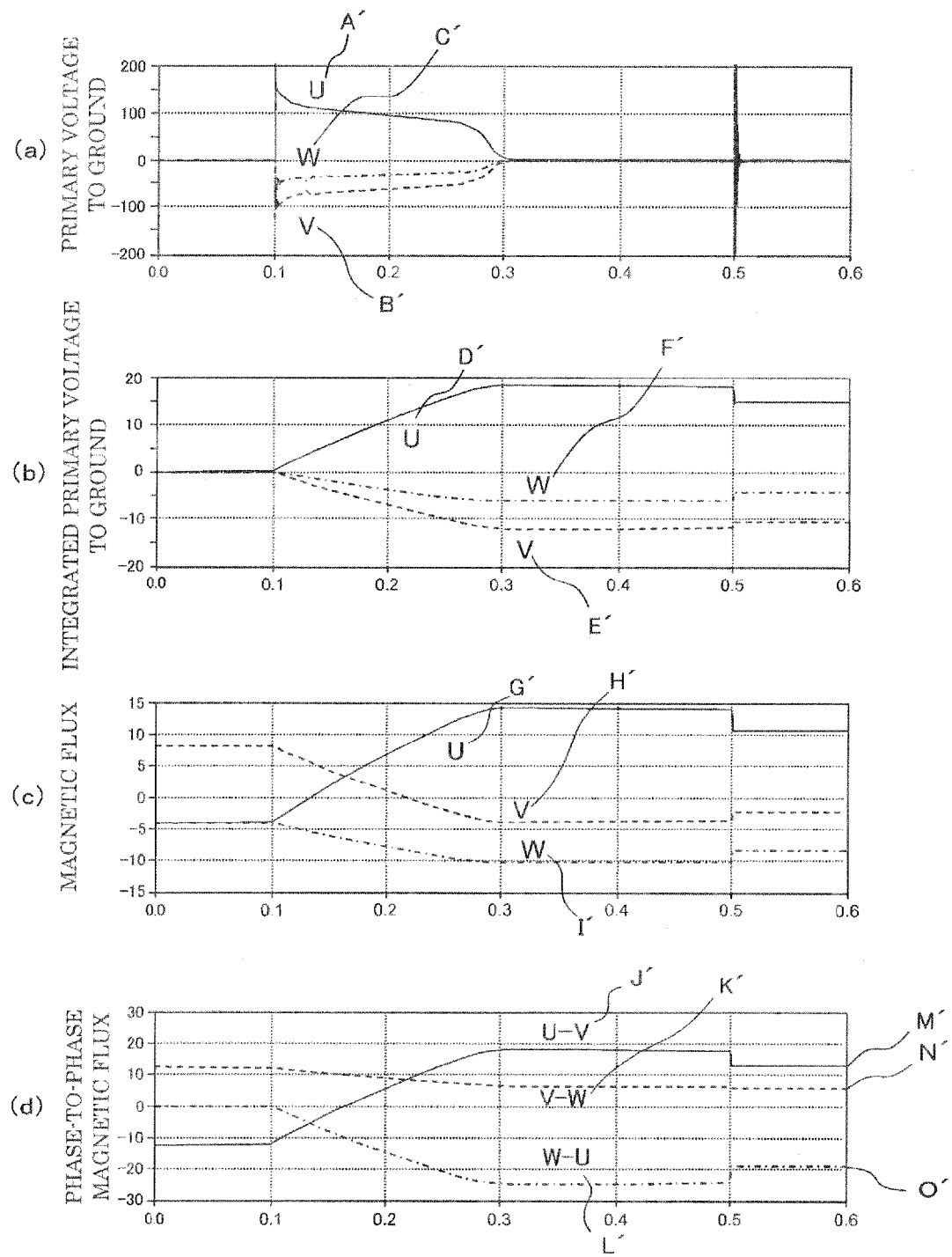
FIGS. 3A to 3D are waveform charts illustrating a relationship between a DC voltage applying terminal and a phase-to-phase magnetic flux according to the first to the fourth embodiments, and illustrating example waveforms having the residual magnetic flux changed from FIGS. 2A to 2D before a DC is applied.

In FIG. 1, reference numeral 100 indicates a three-phase breaker, reference numeral 200 indicates a three-phase transformer that is loaded to or cut off from a power-source bus by the three-phase breaker, and reference numeral 300 indicates a DC power source. In the three-phase transformer 200, a primary winding 201 is subjected to a Y connection, and a secondary winding 202 is subjected to a Δ connection. The DC power source 300 applies a DC voltage across two terminals of the secondary winding or a tertiary winding that is the Δ connection of the three-phase transformer 200 through a connection 301. In the example case illustrated in FIG. 1, the DC power source 300 is connected between the U and V terminals of the secondary winding 202.

The residual magnetic flux estimation device 1 includes a DC power-source control device 11 that controls the DC power source 300 to apply a DC voltage across the two terminals of the Δ connection which is the secondary or tertiary winding, and a voltage measuring device 12 that measures a terminal voltage at the primary side of the three-phase transformer 200. Moreover, the residual magnetic flux estimation device 1 includes a computing device 13 that determines a phase having a high voltage as a high-voltage phase between the two phases other than the phase to which the voltage is applied, and a residual magnetic flux measuring device 14 which measures the phase-to-phase residual magnetic flux in each phase, and which determines a phase-to-phase residual magnetic flux of the two phases other than the high-voltage phase among the measured values as the maximum magnetic flux in the measurement-target transformer.

The illustrated connection structure of the DC power source 300 merely indicates an embodiment, and the DC power source may be connected between V and W terminals, W and U terminals, or to the tertiary winding as other structures.

A transformer having a neutral point ungrounded is employed in FIG. 1, but this merely indicates an embodiment. The residual magnetic flux estimation device 1 is applicable to a transformer of a direct-grounding system or a transformer of a non-effective grounding system (a transformer of a resistance-grounded system). Moreover, it is also applicable to a three-phase transformer having connections other than those in FIG. 1, such as a three-phase transformer having a primary winding subjected to a Y connection, and the secondary and tertiary windings subjected to a Δ connection.

[1-2. Workings]

The residual magnetic flux estimating method of the first embodiment employing the above-explained structure will now be explained below.

As explained above, it is presumed in this embodiment that a field test or an inspection accompanying an application of a DC voltage to the transformer winding, such as a winding resistance measurement of a transformer or a polarity check of a current transformer, is performed, and a residual magnetic flux generated when the transformer is cut off changes, and the residual magnetic flux has a value changed when the test or the inspection completes. Thus, a condition in which any DC magnetic flux remains in the transformer core is defined as an initial condition when the residual magnetic flux is estimated in this embodiment.

In this embodiment, the DC power-source control device 11 controls the DC power source 300 to apply a DC voltage across the terminals of the three-phase transformer 200 subjected to the Δ connection through the connection 301 connected to those terminals. In the example case illustrated in FIG. 1, the DC voltage from the DC power source 300 is applied across the U and V terminals of the secondary winding 202.

Next, the voltage measuring device 12 measures a terminal voltage at the primary side of the three-phase transformer 200. Subsequently, the computing device 13 determines the phase having a high voltage as the high-voltage phase between the two phases other than the phase to which the voltage is applied. Thereafter, the residual magnetic flux measuring device 14 measures the phase-to-phase residual magnetic flux in each phase, and estimates the phase-to-phase residual magnetic flux of the two phases other than the high-voltage phase as the maximum magnetic flux of the measurement-target three-phase transformer among the measured phase-to-phase residual magnetic fluxes of respective phases.

A theoretical basis of the estimating method of this embodiment carried out through the above-explained procedures will be explained below. In FIG. 2A, symbols A to C in the figure indicate waveforms obtained by measuring a terminal voltage at the primary side of the three-phase transformer 200 after the DC voltage from the DC power-source control device 11 is applied. This figure indicates a case in which the application of the DC voltage starts at the time point of 0.1 seconds and the application of the DC voltage terminates at the time point of 0.5 seconds.

Symbols D to F in in FIG. 2B indicate magnetic fluxes of respective phases (U-phase, V-phase, and W-phase) obtained by integrating the symbols A to C in FIG. 2A. In this figure, the magnetic fluxes of respective phases (U-phase, V-phase, and W-phase) start changing from 0, and it becomes clear that the residual magnetic fluxes of the core do not appear before the DC voltage is applied.

Conversely, symbols G to I in FIG. 2C are magnetic fluxes in consideration of a residual magnetic flux (before the DC voltage is applied) generated when the transformer is cut off. The residual magnetic fluxes of respective phases before the DC voltage is applied are 8.2 Wb for the U-phase, −7.1 Wb for the V-phase, and −1.1 Wb for the W-phase.

As illustrated in FIG. 2A, a current flowing into the transformer from the DC power source increases at a time constant which is determined based on the exciting inductance and coil resistance of the transformer and the internal resistance of the DC power source from 0, and becomes constant at a time point which is determined by that time constant.

During the time period at which the current is increasing, as indicated by symbols A to C in FIG. 2A, the DC voltage appears in each terminal. The reason why the voltages of respective three phases become 0 after 0.16 seconds or so is that the current from the power supply becomes a constant value. The time at which the DC voltage appears in each terminal changes depending on the capacity of the transformer and that of the DC power source.

Symbols J to L in FIG. 2D are phase-to-phase magnetic fluxes of the three phases of the transformer obtained by converting the symbols G to I in FIG. 2C. Moreover, number symbols M to O in FIG. 2D indicate respective phase-to-phase residual magnetic fluxes after the application of the DC voltage is terminated.

As represented by FIG. 2D, regarding the phase-to-phase residual magnetic flux, the phase-to-phase residual magnetic flux (M in the figure) is the maximum between the U-phase and the V-phase. When observing the voltages of the V-phase and the W-phase at the time point at which the DC voltage is applied, the voltage of the W-phase is higher than that of the V-phase as illustrated in FIG. 2A.

That is, according to this embodiment, as explained above, the DC power-source control device 11 causes the DC power source 300 to apply the DC voltage across the U and V terminals of the secondary winding 202. The voltage measuring device 12 measures the voltages of respective terminals at this time. Based on those results, the computing device 13 specifies the phase having a high voltage as the high-voltage phase between the two phases (in FIG. 2, the W-phase) to which no DC voltage is applied. Thereafter, when the residual magnetic flux measuring device 14 measures the phase-to-phase residual magnetic flux in each phase, it becomes clear that the phase-to-phase residual magnetic flux (in FIG. 2, between the U-phase and the V-phase) of the two phases (in FIG. 2, the U-phase and the V-phase) other than the specified high-voltage phase can be estimated as the maximum residual magnetic flux in the measurement-target three-phase transformer.

FIGS. 3A to 3D illustrate a case in which the value of the residual magnetic flux before a transformer DC is applied is changed under the same condition as those of FIGS. 2A to 2D. In FIG. 3C, the residual magnetic fluxes of respective phases before the DC voltage is applied are −4.1 Wb for the U-phase, +8.2 Wb for the V-phase, and −4.1 Wb for the W-phase.

In FIG. 3A, when observing the voltages of the V-phase and the W-phase (the two phases to which no DC voltage is applied) when the DC is applied, the voltage, of the V-phase becomes high. Conversely, as illustrated in FIG. 3D, the phase-to-phase residual magnetic flux between the W phase and the U-phase becomes the maximum which are the two phases other than the V phase having the high voltage. Hence, regardless of the value of the residual magnetic flux before the DC is applied, by observing the voltage before the DC voltage is applied, i.e., by specifying the phase having a high voltage between the two phases to which no DC voltage is applied, it becomes possible to estimate the phase-to-phase residual magnetic flux between the two phases other than that specified phase as the maximum residual magnetic flux in the transformer after the DC voltage is applied.

[1-3. Advantages]

As explained above, according to this embodiment, even in a case in which a field test or an inspection accompanying an application of a DC voltage to the transformer winding, such as a winding resistance measurement of a transformer or a polarity check of a current transformer, is performed, the maximum phase-to-phase residual magnetic flux, i.e., the maximum value of the residual magnetic fluxes in the measurement-target transformer can be estimated. As a result, the residual magnetic flux in the transformer after the test or the inspection can be estimated precisely, and an excitation inrush current can be surely suppressed.

2. Second Embodiment

In a second embodiment, when no voltage measuring unit is installed at the primary side of the transformer 200, by measuring the terminal voltage at the secondary or the tertiary Δ-connection side, a primary-side terminal voltage is obtained. Other structures of the second embodiment are basically in common with those of the first embodiment illustrated in FIG. 1.

Figure 4:
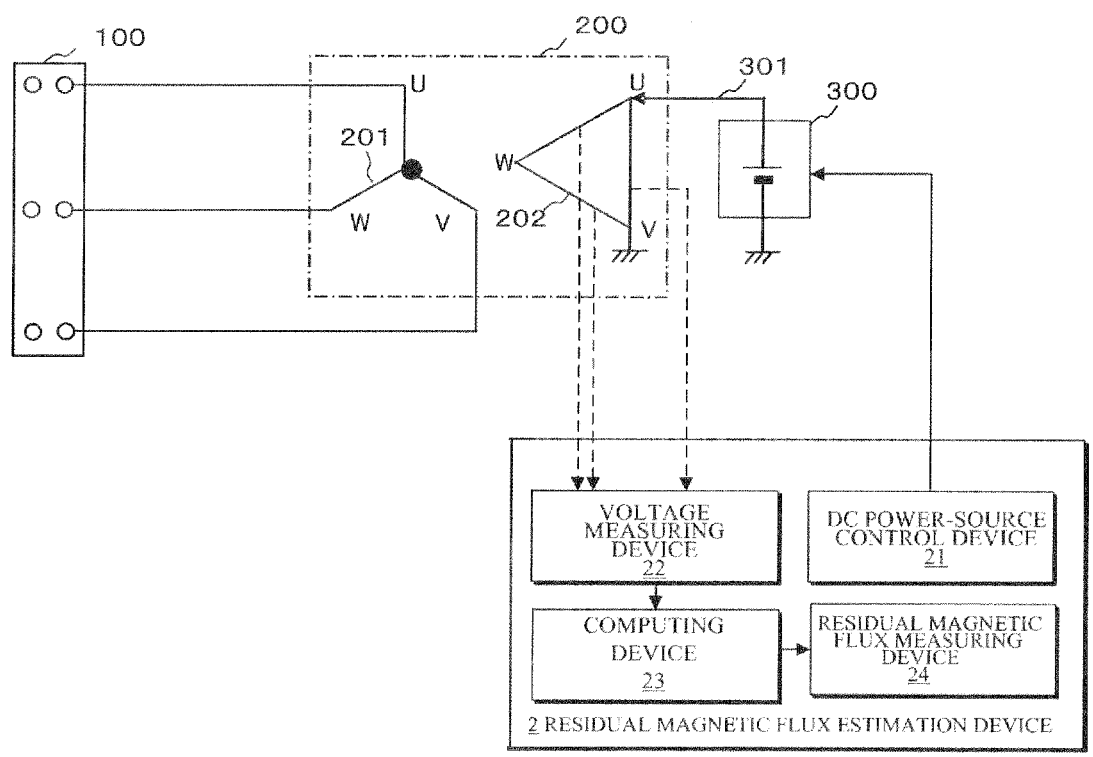
FIG. 4 is a block diagram illustrating a connection relationship among a residual magnetic flux estimation device, a transformer, and a breaker according to the second embodiment.

More specifically, as illustrated in FIG. 4, a residual magnetic flux estimation device 2 of the second embodiment employs the following structures.

(1) A DC power-source control device 21 which controls the DC power source 300 and which applies a DC voltage across the two terminals of the Δ connection that is the secondary or tertiary winding.

(2) A voltage measuring device 22 that measures a terminal voltage of each terminal of the Δ connection of the three-phase transformer 200.

(3) A computing device 23 which computes a phase-to-phase voltage by subtracting each terminal voltage and which determines a phase having a higher phase-to-phase voltage as a high-voltage phase between the two phases other than the phase to which the voltage is applied.

(4) A residual magnetic flux measuring device 24 which measures the phase-to-phase residual magnetic flux of each phase and which determines a phase-to-phase residual magnetic flux of the two phases other than the high-voltage phase among the measured values as the maximum magnetic flux in the measurement-target transformer.

Likewise the first embodiment, it is presumed in the second embodiment that a field test or an inspection accompanying an application of a DC voltage to the transformer winding, such as a winding resistance measurement of a transformer or a polarity check of a current transformer, is performed, a residual magnetic flux generated when the transformer is cut off changes, and the residual magnetic flux has a value changed when the test or the inspection completes. Thus, a condition in which any DC magnetic flux remains in the transformer core is defined as an initial condition when the residual magnetic flux is estimated in this embodiment.

The power-source control device 21 controls the DC power source 300 to apply a DC voltage across the terminals of the Δ connection of the three-phase transformer 200 through the connection 301. According to this embodiment, as illustrated in FIG. 1, a DC voltage from the DC power source 300 is applied across the U and V terminals of the secondary winding 202.

Next, the voltage measuring device 22 measures a terminal voltage of each terminal of the Δ connection of the three-phase transformer 200, and determines a terminal voltage at the primary side of the three-phase transformer 200 after the DC voltage is applied based on the measured values. Subsequently, the computing device 23 calculates a phase-to-phase voltage by subtracting each terminal voltage.

This phase-to-phase voltage is equal to the terminal voltage at the primary side, and thus the same workings can be obtained when no voltage measuring unit is installed at the primary side of the transformer or when the measurement is difficult. Based on the terminal voltages obtained in this manner, the computing device 23 determines the phase having a high voltage as the high-voltage phase between the two phases other than the phase to which the voltage is applied. Thereafter, the residual magnetic flux measuring device 24 measures the phase-to-phase residual magnetic flux of each phase, and estimates the phase-to-phase residual magnetic flux of the two phases other than the phase determined as the high-voltage phase as the maximum magnetic flux of the measurement-target three-phase transformer among the measured phase-to-phase residual magnetic fluxes of respective phases.

As explained above, according to this embodiment, even when no voltage measuring unit is installed at the primary side of the transformer, if a field test or an inspection accompanying an application of a DC voltage to the transformer winding, such as a winding resistance measurement of a transformer or a polarity check of a current transformer, is performed, the maximum residual magnetic fluxes in the measurement-target transformer can be estimated. As a result, the residual magnetic fluxes after the test or the inspection of the transformer can be precisely estimated, and an excitation inrush current can be surely suppressed.

3. Third Embodiment

The basic structure of the residual magnetic flux estimation device of a third embodiment is basically consistent with that of the first embodiment. According to the third embodiment, a device that performs the following calculation in addition to the function of the first embodiment as the computing device 13 is used.

(1) Determine whether the phase-to-phase voltages of the two phases other than the terminal voltages at the primary side or the voltage-applied phase at the h-connection side are equal or not.

(2) When the voltages of the two phases are equal, determine phase-to-phase voltage between the voltage applied phase and the next phase in a vector representation or phase-to-phase voltage between the voltage applied phase and the previous phase in the vector representation.

Moreover, the residual magnetic flux measuring device 14 measures a phase-to-phase residual magnetic flux of each phase, and the computing device 13 estimates a phase-to-phase residual magnetic flux between the voltage applied phase and the next phase in the vector representation or between the voltage applied phase and the previous phase in the vector representation among the measured phase-to-phase residual magnetic fluxes of respective phases as the maximum residual magnetic flux in the measurement-target three-phase transformer.

The third embodiment employing the above-explained structures has the following workings. That is, a scope of the third embodiment is, likewise the first embodiment, for example, a case in which a field test or an inspection accompanying an application of a DC voltage to the winding of a transformer, such as a winding resistance measurement of a transformer or a polarity check of a current transformer, is performed, a residual magnetic flux generated when the transformer is cut off changes, and the residual magnetic flux has a value changed when the test or the inspection completes.

Figure 5:
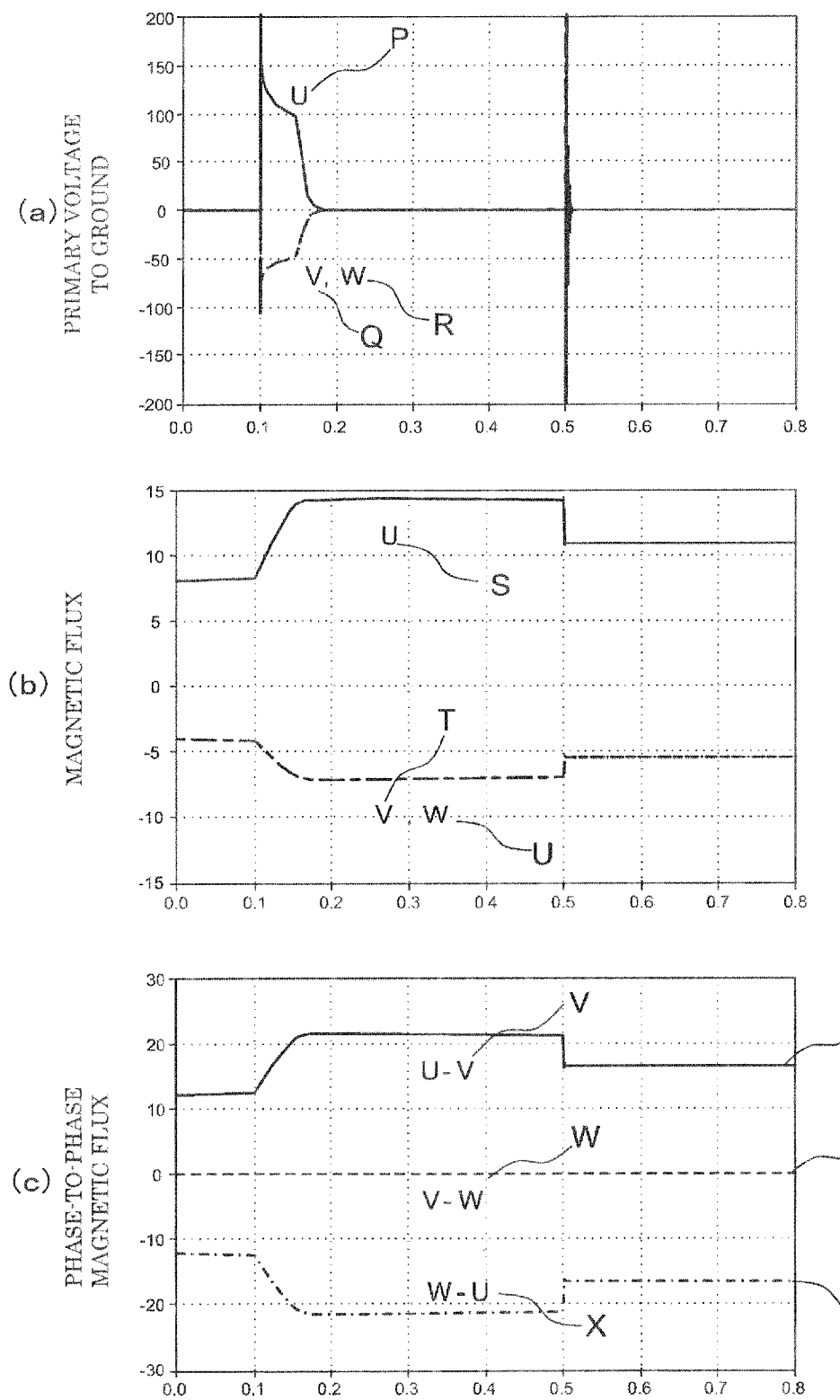
FIGS. 5A to 5C are graphs illustrating phase-to-phase magnetic fluxes before and after a DC voltage is applied according to the third embodiment.

Thus, with a condition in which any DC magnetic flux remains in the transformer core being defined as an initial condition, a residual magneticflux estimating method in this embodiment will now be explained with reference to FIGS. 1 and 5. A DC voltage from the DC power source 300 is applied across the terminals of the Δ connection of the three-phase transformer 200 through the connection 301. In the example case illustrated in FIG. 1, the DC voltage from the DC power source 300 is applied across the U and V terminals of the secondary winding 202.

In FIG. 5A, symbols P to R in the figure indicate waveforms obtained by measuring a terminal voltage at the primary side of the three-phase transformer 200 after the DC voltage is applied by the DC power-source control device 11. This figure indicates a case in which the application of the DC voltage starts at the time point of 0.1 seconds and the application of the DC voltage is terminates at the time point of 0.5 seconds.

In FIG. 5B, symbols S to U in the figure are conditions in consideration of a residual magnetic flux (before the DC voltage is applied) generated when the transformer is cut off, and indicate the magnetic fluxes of respective phases (U-phase, V-phase, and W-phase) of the transformer calculated by integrating the symbols P to R in FIG. 5A. The residual magnetic fluxes of respective phases before the DC voltage is applied are 8.2 Wb for the U-phase, −4.1 Wb for the V-phase., and −4.1 Wb for the W-phase.

As illustrated in FIG. 5B, when only one phase has the large residual magnetic flux of the transformer before the DC voltage is applied and the other two phases have the residual magnetic flexes that are the half of the former value and have a reversed polarity, the voltages of the other two phases appear as divided voltages of the phase to which the DC voltage is applied through the Δ connection. That is, it becomes the same value as the half of the voltage of the phase to which the DC voltage is applied. The magnetic fluxes of the other two phases changes due to such a voltage, but the other two phases have the same start point of a core excitation characteristic, the magnetic fluxes transition at the same value, and the residual magnetic fluxes after the application of the DC voltage is terminated become the same value.

Conversely, symbols V to X in FIG. 5C are phase-to-phase magnetic fluxes of the three phases of the transformer obtained by converting symbols S to U in FIG. 5B. Moreover, number symbols Y to AA in FIG. 5C indicate respective phase-to-phase residual magnetic fluxes after the application of the DC voltage terminated.

As is represented in FIG. 5C, regarding the phase-to-phase residual magnetic flux, the phase-to-phase residual magnetic flux (Y in the figure) between the U-phase and the V-phase and the phase-to-phase residual magnetic flux (AA in the figure) between the W-phase and the U-phase became the maxima.

That is, the phase-to-phase residual magnetic flux between the voltage applied phase and the next phase in the vector representation and the phase-to-phase residual magnetic flux between the voltage applied phase and the previous phase in the vector representation become equal, and thus it can be estimated that the residual magnetic flux of the transformer becomes the maximum in both of the phase-to-phase residual magnetic fluxes. Thus, regardless of how the residual magnetic flux of the transformer appears before a DC is applied, it can be estimated between phases the residual magnetic flux becomes maximum after the DC is applied.

As explained above, according to this embodiment, even if a DC voltage is applied until the magnetic flux is saturated when a field test or an inspection, etc., accompanying an application of the DC voltage to the transformer winding is performed, the maximum phase-to-phase residual magnetic flux can be estimated. Moreover, since it can be estimated between which phases the residual magnetic flux becomes maximum through the above-explained method, an excitation inrush current at the time of letting the transformer loaded can be suppressed.

4. Fourth Embodiment

A scope of a residual magnetic flux estimation device 4 of a fourth embodiment is, likewise each of the above-explained embodiments, a case in which a field test or an inspection accompanying an application of a DC voltage to the winding of a transformer is performed, a residual magnetic flux generated when the transformer is cut off changes, and the residual magnetic flux has a value changed when the test or the inspection completes.

Figure 6:
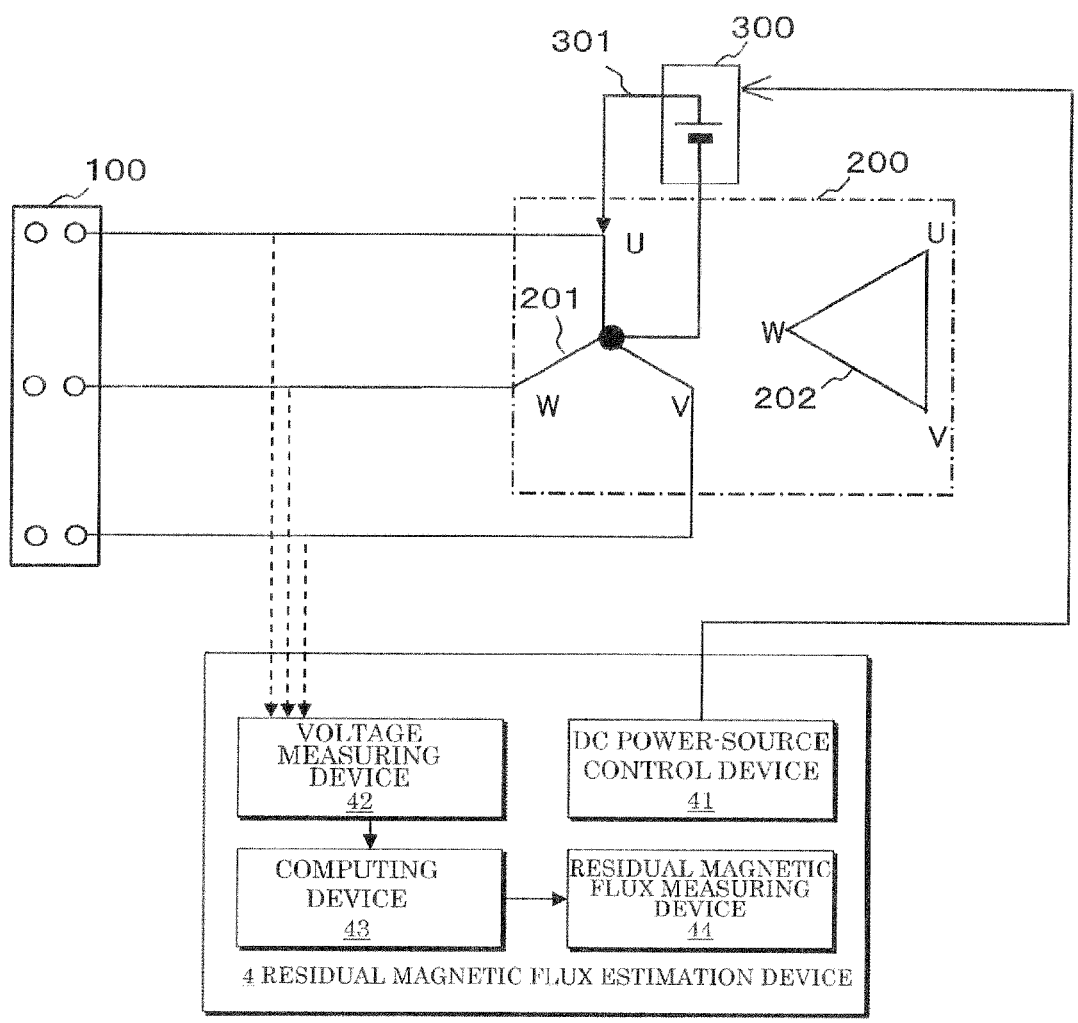
FIG. 6 is a block diagram illustrating a connection relationship among a residual magnetic flux estimation device, a transformer, and a breaker according to the fourth embodiment.
Figure 7:
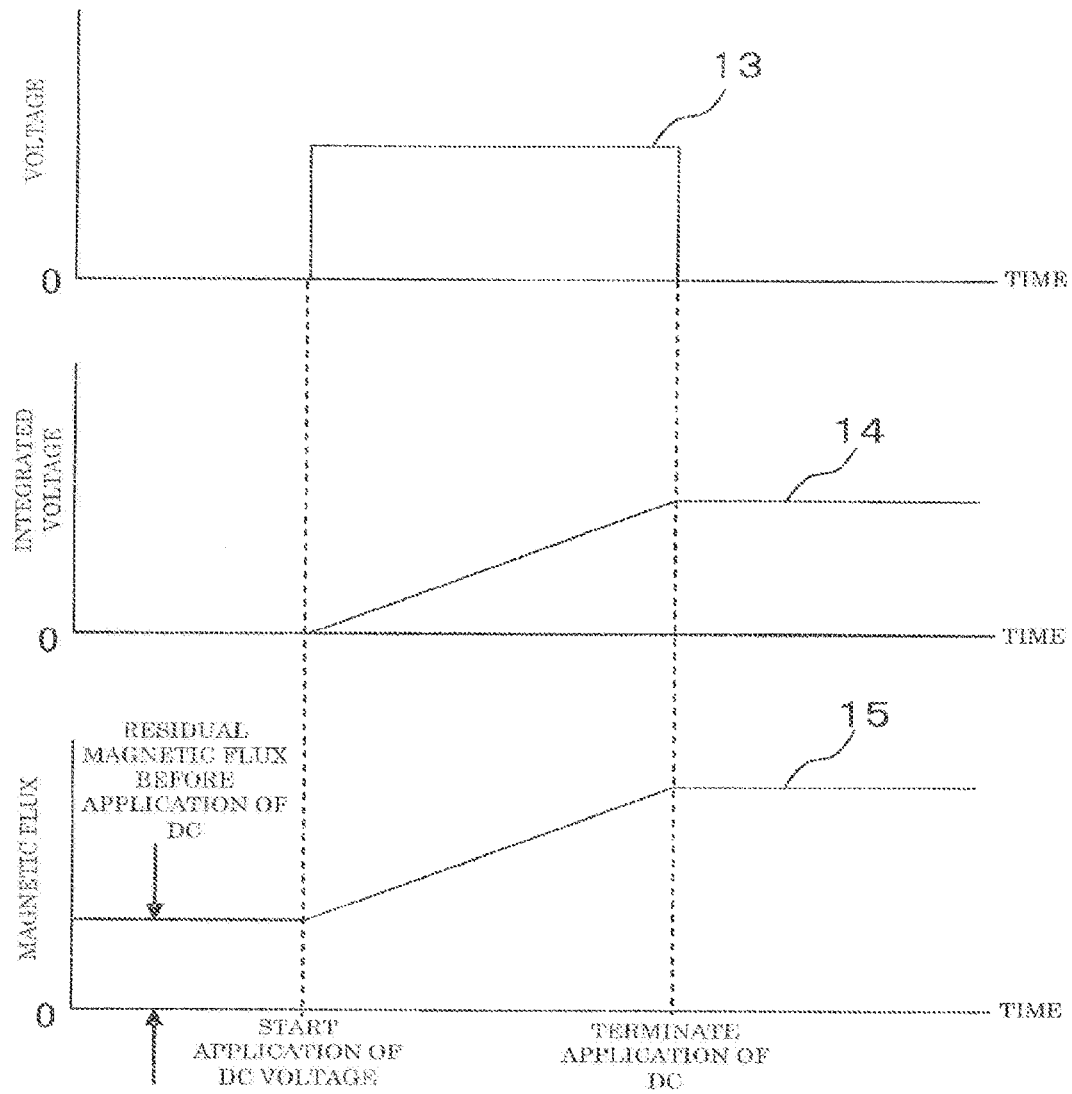
FIG. 7 is a waveform chart illustrating a voltage waveform when a DC voltage is applied, a waveform obtained by integrating the voltage waveform, and a magnetic flux waveform in consideration of a condition before a DC voltage is applied.

FIG. 6 is a block diagram illustrating a function of the residual magnetic flux estimation device 4 according to the fourth embodiment, and is a diagram illustrating a connection relationship between a three-phase breaker and a three-phase transformer in order to carry out a residual magnetic flux estimating method by the residual magnetic flux estimation device 4.

In FIG. 6, reference numeral 100 indicates a three-phase breaker. Reference numeral 200 indicates a three-phase transformer thin is loaded to or cut off from an power-source bus by the three-phase breaker, and a primary winding 201 of the three-phase transformer is subjected to a Y connection, and a secondary winding 202 thereof is subjected to a Δ connection.

Reference numeral 300 indicates a DC power source which applies a DC voltage across a primary winding terminal and a neutral point that are the Y connection of the three-phase transformer 200 through a connection 301. In the example case illustrated in FIG. 6, the DC power source 300 is connected between the U terminal of the primary winding 201 and the neutral point.

The residual magnetic flux estimation device 4 has the same structural elements as those of the first embodiment, and includes a DC power-source control device 41 which controls the DC power source 300 and which applies a DC voltage across the two terminals of the Δ connection that is the secondary winding or a tertiary winding, and a voltage measuring device 42 that measures a terminal voltage at the primary side of the three-phase transformer 200. Moreover, the residual magnetic flux estimation device 1 includes a computing device 43 that determines a phase having a high voltage as a high-voltage phase between the two phases other than the phase to which the voltage is applied, and a residual magnetic flux measuring device 44 which measures the phase-to-phase residual magnetic flux in each phase, and which determines a phase-to-phase residual magnetic flux of the two phases other than the high-voltage phase among the measured values as the maximum magnetic flux in the measurement-target transformer.

According to the above-explained structures, the DC power source 300 may be connected between the V terminal of the secondary winding 201 and the neutral point, or between the V terminal and the neutral point. Moreover, as illustrated in FIG. 6, a transformer having a neutral point ungrounded is used in this embodiment, but, for example transformer of a direct-grounding system and a transformer of a non-effective grounding system (a transformer of a resistance-grounded system) are applicable. Furthermore, it is also possible to use a three-phase transformer having connections other than those illustrated FIG. 6, such as a three-phase transformer having a primary winding subjected to a Y connection, and secondary and tertiary windings subjected to Δ connection.

The residual magnetic flux estimating method of this embodiment will now be explained. Likewise each of the above-explained embodiments, this embodiment is intended for a transformer in a condition in which any DC magnetic flux remains in a core, and the residual magnetic flux of the transformer is estimated.

First, the DC power-source control device 41 applies a DC voltage across the terminal of the Y connection of the three-phase transformer 200 and the neutral point through the connection 301 from the DC power source 300. In the example case illustrated in FIG. 6, the DC voltage is applied across the U terminal of the primary winding 201 and the neutral point from the DC power source 300. In the above-explained condition, when the voltage measuring device 42 measures a terminal voltage at the primary side of the three-phase transformer 200 after the DC voltage is applied, the same voltages as those of respective symbols A to C illustrated in FIGS. 2A to 2D indicated in the first embodiment can be obtained.

At this time, the magnetic fluxes of respective phases of the transformer calculated by integrating the terminal voltages at the primary side are in the same waveforms as those of symbols D to F illustrated in FIGS. 2A to 2D. Moreover, the same waveforms can be also obtained at this time by measuring respective terminal voltages at the Δ side.

Hence, when the DC voltage is applied across the primary winding terminal of an arbitrary phase of the three-phase transformer and the neutral point, by the computing device 43 and the residual magnetic flux measuring device 44, it can be estimated between which phases the residual magnetic flux of the transformer becomes maximum by the same method as that of the first embodiment, and the maximum value of the residual magnetic fluxes can be estimated based on the estimation result.

As explained above, according to the fourth embodiment, even if a DC voltage is applied across the primary winding terminal of an arbitrary phase of the three-phase transformer and the neutral point when a field test or an inspection accompanying an application of a DC voltage to the transformer winding, such as a winding resistance measurement of a transformer or a polarity check of a current transformer, is performed, it can be estimated between which phases the residual magnetic flux is maximum. As a result, the residual magnetic flux in the transformer can be precisely estimated, and an excitation inrush current at the time of letting the transformer loaded can be effectively suppressed.

DESCRIPTION OF REFERENCE NUMERALS 1,2,4 Residual magnetic flux estimation device
11 DC power-source control device
12 Voltage measuring device
13 Computing device
14 Residual magnetic flux measuring device
21 DC power-source control device
22 Voltage measuring device
23 Computing device
24 Residual magnetic flux measuring device
41 DC power-source control device
42 Voltage measuring device
43 Computing device
44 Residual magnetic flux measuring device
100 Three-phase breaker
200 Three-phase transformer
201 Primary winding
202 Secondary winding
300 DC power source
301 Connection

What is claimed is:

1. A residual magnetic flux estimating method of a transformer, the method comprising:
a step for applying, to a three-phase transformer having a primary winding connected to a Y connection and a secondary winding or a tertiary winding subjected to a Δ connection, a DC voltage to a phase connected between predetermined two terminals of the Δ connection;
a step for measuring terminal voltages of two phases other than the phase to which the DC voltage is applied at a primary side of the three-phase transformer;
a step for determining a phase having a higher measured terminal voltage as a high-voltage phase between the two phases where the terminal voltages are measured; and
a step for measuring a phase-to-phase residual magnetic flux between the two phases other than the high-voltage phase and estimating the phase-to-phase residual magnetic flux as a maximum residual magnetic flux in the measurement-target three-phase transformer.

2. A residual magnetic flux estimating method of a transformer, the method comprising:
a step for applying, to a three-phase transformer having a primary winding connected to a Y connection and a secondary winding or a tertiary winding subjected to a Δ connection, a DC voltage to a phase connected between predetermined two terminals of the Δ connection;
a step for measuring a terminal voltage of each terminal of the Δ connection of the three-phase transformer and calculating a phase-to-phase voltage of each phase connected between respective terminals by subtracting each measured terminal voltage;
a step for determining a phase having a higher calculated line voltage as a high-voltage phase between the two phases other than the phase to which the DC voltage is applied among respective phases where the terminal voltages are measured; and
a step for measuring a phase-to-phase residual magnetic flux between the two phases other than the high-voltage phase and estimating the phase-to-phase residual magnetic flux as a maximum residual magnetic flux in the measurement-target three-phase transformer.

3. The transformer residual magnetic flux estimating method according to claim 1, wherein
when the terminal voltages at the primary side or the voltages of the two phases other than the voltage applied phase of a line voltage at the Δ-connection side become equal, a phase-to-phase residual magnetic flux between the voltage applied phase and the next phase in a vector representation or between the voltage applied phase and the previous phase in the vector representation is estimated as the maximum residual magnetic flux in the measurement-target three-phase transformer.

4. The transformer residual magnetic flux estimating method according to claim 2, wherein
when the terminal voltages at the primary side or the voltages of the two phases other than the voltage applied phase of a line voltage at the Δ-connection side become equal, a phase-to-phase residual magnetic flux between the voltage applied phase and the next phase in a vector representation or between the voltage applied phase and the previous phase in the vector representation is estimated as the maximum residual magnetic flux in the measurement-target three-phase transformer.

5. The transformer residual magnetic flux estimating method according to claim 1, wherein
in the step for applying the DC voltage to the phase connected between the predetermined two terminals of the Δ connection,
the DC voltage is applied across a terminal of a predetermined phase at the primary side and a neutral point.

6. The transformer residual magnetic flux estimating method according to claim 2, wherein
in the step for applying the DC voltage to the phase connected between the predetermined two terminals of the Δ connection,
the DC voltage is applied across a terminal of a predetermined phase at the primary side and a neutral point.

7. The transformer residual magnetic flux estimating method according to claim 3, wherein
in the step for applying the DC voltage to the phase connected between the predetermined two terminals of the Δ connection,
the DC voltage is applied across a terminal of a predetermined phase at the primary side and a neutral point.

8. The transformer residual magnetic flux estimating method according to claim 4, wherein
in the step for applying the DC voltage to the phase connected between the predetermined two terminals of the Δ connection,
the DC voltage is applied across a terminal of a predetermined phase at the primary side and a neutral point.

9. A residual magnetic flux estimation device of a transformer, the device comprising:
a measurement-target three-phase transformer having a primary winding connected to a Y connection, and a secondary winding or a tertiary winding subjected to a Δ connection;
a DC power source which applies a DC voltage to a phase connected between predetermined two terminals of the Δ connection in the three-phase transformer;

a voltage measuring device that measures a terminal voltage of two phases other than the phase to which the DC voltage is applied at a primary side of the three-phase transformer;

a computing device that determines a phase having a high measured terminal voltage as a high-voltage phase between the two phases where the terminal voltages are measured; and a residual magnetic flux measuring device which measures a phase-to-phase residual magnetic flux between the two phases other than the high-voltage phase, and which estimates a measured value of the phase-to-phase residual magnetic flux as a maximum residual magnetic flux in the measurement-target three-phase transformer.

10. A residual magnetic flux estimation device of a transformer, the device comprising:

a measurement-target three-phase transformer having a primary winding connected to a Y connection, and a secondary winding or a tertiary winding subjected to a Δ connection;

a DC power source which applies a DC voltage to a phase connected between predetermined two terminals of the Δ connection;

a voltage measuring device that measures a terminal voltage of each terminal of the Δ connection of the three-phase transformer;

a computing device which calculates a phase-to-phase voltage of each phase connected between respective terminals by subtracting each terminal voltage measured by the voltage measuring device, and which determines a phase having a higher phase-to-phase voltage as a high-voltage phase between the two phases other than the phase to which the DC voltage is applied among respective phases where the terminal voltages are measured; and a residual magnetic flux measuring device which measures a phase-to-phase residual magnetic flux between the two phases other than the high-voltage phase, and which estimates a measured value of the phase-to-phase residual magnetic flux as a maximum residual magnetic flux in the measurement-target three-phase transformer.

* * * * *